United States Patent
Housako

(10) Patent No.: US 6,865,698 B2
(45) Date of Patent: Mar. 8, 2005

(54) METHOD AND APPARATUS FOR TESTING SEMICONDUCTOR DEVICES

(75) Inventor: Takahiro Housako, Tokyo (JP)

(73) Assignee: Advantest Corporation, Tokyo (JP)

( * ) Notice: Subject to any disclaimer, the term of this patent is extended or adjusted under 35 U.S.C. 154(b) by 627 days.

(21) Appl. No.: 09/900,085

(22) Filed: Jul. 5, 2001

(65) Prior Publication Data

US 2002/0003433 A1 Jan. 10, 2002

(30) Foreign Application Priority Data

Jul. 6, 2000 (JP) ........................ 2000-204757

(51) Int. Cl.$^7$ .................. H03M 13/00; G11B 5/00
(52) U.S. Cl. ........................ 714/700; 714/709
(58) Field of Search ................ 324/750–765; 714/724–738, 700, 709; 326/16

(56) References Cited

U.S. PATENT DOCUMENTS

| | | | | |
|---|---|---|---|---|
| 5,579,251 A | * | 11/1996 | Sato ........................... | 702/117 |
| 5,621,739 A | * | 4/1997 | Sine et al. ................... | 714/724 |
| 5,732,047 A | * | 3/1998 | Niijima ....................... | 368/10 |
| 6,016,565 A | * | 1/2000 | Miura ......................... | 714/736 |
| 6,421,789 B1 | * | 7/2002 | Ooishi .......................... | 714/7 |
| 6,486,693 B1 | * | 11/2002 | Conner et al. ............... | 324/765 |
| 6,629,274 B1 | * | 9/2003 | Tripp et al. ................. | 714/721 |
| 6,647,521 B2 | * | 11/2003 | Matsui ........................ | 714/719 |
| 6,693,436 B1 | * | 2/2004 | Nelson ........................ | 324/537 |
| 2001/0052097 A1 | | 12/2001 | Miura | |

FOREIGN PATENT DOCUMENTS

| | | |
|---|---|---|
| DE | 10 101899 | 11/2001 |
| JP | 08062296 | 3/1996 |
| JP | 11237454 | 8/1999 |
| KR | 990072577 | 9/1999 |

* cited by examiner

Primary Examiner—Emmanuel L. Moise
Assistant Examiner—John Trimmings
(74) Attorney, Agent, or Firm—David N. Lathrop, Esq.; Gallagher & Lathrop

(57) ABSTRACT

In a semiconductor device which outputs read-out data and a reference clock synchronized therewith for use in passing the data to other device, the generating timing of the reference clock and the generating timing of the data are compared by timing comparators 11A and 11B with first and second strobe pulses, and the logical values of the timing comparison result are compared by logic comparators 12A and 12B with first and second expected values. A logical condition decider 13 decides whether the combination of the logical comparison results satisfies a predetermined condition. When the predetermined condition is met, the decider 13 decides that the phase difference between the reference clock and the data is larger than a predetermined value, or that the duration of the data is longer than a predetermined time.

11 Claims, 14 Drawing Sheets

| COMPARISON TIMING | T1 | T2 | T3 | T4 | T5 | T6 |
|---|---|---|---|---|---|---|
| 1st LOGIC COMP 12A OUTPUT | 1 | 1 | 1 | 0 | 0 | 0 |
| 2nd LOGIC COMP 12B OUTPUT | 1 | 1 | 1 | 0 | 0 | 0 |

| COMPARISON TIMING | T1 | T2 | T3 | T4 | T5 | T6 |
|---|---|---|---|---|---|---|
| 1st LOGIC COMP 12A OUTPUT | 1 | 1 | 1 | 0 | 0 | 0 |
| 2nd LOGIC COMP 12B OUTPUT | 1 | 0 | 0 | 0 | 0 | 0 |

| COMPARISON TIMING | T1 | T2 | T3 | T4 | T5 | T6 |
|---|---|---|---|---|---|---|
| 1st LOGIC COMP 12A OUTPUT | 1 | 1 | 0 | 0 | 0 | 0 |
| 2nd LOGIC COMP 12B OUTPUT | 1 | 1 | 1 | 1 | 0 | 0 |

| COMPARISON TIMING | T1 | T2 | T3 | T4 | T5 | T6 |
|---|---|---|---|---|---|---|
| 1st LOGIC COMP 12A OUTPUT | 1 | 1 | 1 | 0 | 0 | 0 |
| 2nd LOGIC COMP 12B OUTPUT | 0 | 0 | 0 | 1 | 1 | 1 |

| COMPARISON TIMING | T1 | T2 | T3 | T4 | T5 | T6 |
|---|---|---|---|---|---|---|
| 1st LOGIC COMP 12A OUTPUT | 1 | 1 | 0 | 0 | 0 | 0 |
| 2nd LOGIC COMP 12B OUTPUT | 0 | 0 | 0 | 0 | 1 | 1 |

| COMPARISON TIMING | T1 | T2 | T3 | T4 | T5 | T6 |
|---|---|---|---|---|---|---|
| 1st LOGIC COMP 12A OUTPUT | 1 | 1 | 1 | 0 | 0 | 0 |
| 2nd LOGIC COMP 12B OUTPUT | 0 | 1 | 1 | 1 | 1 | 1 |

FIG. 11A

COMPARISON WITH DQ LEADING EDGE

| INPUT | | DECISION RESULTS |
|---|---|---|
| PA1 | PA2 | OUTPUT OF DECIDER 13 |
| 0 | 0 | 0 |
| 1 | 0 | 0 |
| 0 | 1 | 1 |
| 1 | 1 | 0 |

FIG. 11B

COMPARISON WITH DQ TRAILING EDGE

| INPUT | | DECISION RESULTS |
|---|---|---|
| PA1 | PA2 | OUTPUT OF DECIDER 13 |
| 0 | 0 | 0 |
| 1 | 0 | 0 |
| 0 | 1 | 0 |
| 1 | 1 | 1 |

METHOD AND APPARATUS FOR TESTING SEMICONDUCTOR DEVICES

BACKGROUND OF THE INVENTION

The present invention relates to a method and apparatus for testing semiconductor devices which output a reference clock and data synchronized therewith.

Among a wide variety of semiconductor devices is a memory of the type that takes in data fed to a terminal together with an input clock and outputs a reference clock and data synchronized therewith. For example, a DDSRDRAM (Double Data Rate Synchronous Dynamic Random Access Memory) takes in address data provided along with an input clock, then generates a reference clock synchronized with the input clock by a DLL (Delayed Locked Loop), and outputs data read out of specified addresses in synchronization with and together with the reference clock, thereby allowing ease in passing data to other devices through utilization of the timing of the reference clock.

FIG. 13 shows how this kind of memory device is read out. In FIG. 13A, reference characters DA, DB, DC, . . . denote pieces of output data from the memory device (data output via a certain pin). Reference characters TD1, TD2, . . . denote test cycles. In FIG. 13B reference character DQS denotes a reference clock that is output from the memory device. The pieces of data DA, DB, DC, . . . (a given one of which will hereinafter be typified by DQ) are output from the memory device in synchronization with the reference clock DQS. The reference clock DQS is used as a sync signal (a data strobe signal) for passing the data DA, DB, DC, . . . to other device when the memory device is in operation.

The testing of this kinds of memory device includes a test item measuring the time differences or intervals (phase differences) dI1, dI2, dI3, . . . between the leading or trailing edges (the leading edges in this example) of respective reference clocks DQS and the points of change of data. For example, the smaller the time differences, the faster the response and consequently the higher the level of performance characteristic. Hence, the above time differences are required to be smaller than a predetermined value Tdq. Further, the time intervals dJ1 and dJ2 between the leading edge of the reference clock DQS and the trailing edge of the data DQ are required to be longer than at least a predetermined value Tdr; this is a requirement for a memory device that is highly valued in the duration of data. The grade of the memory device under test depends on these time lengths.

While in operation, an external clock is applied to the memory device, which, in turn, generates the reference clock DQS based on the clock and outputs the data DQ in synchronization with the reference clock DQS. Accordingly, in the testing of the memory device by a tester, too, a clock is applied from the tester side to the memory device under test, which generates the reference clock DQS based on the clock and outputs the data DS as well as the reference clock DQS that is used for passing the data to other device. Since the point of change of the data DQ is defined with respect to the timing of the leading or training edge of the reference clock DQS, the test of the memory device measures and evaluates the time intervals dI1, dI2, dI3, . . . , or dJ1, dJ2, dJ3, . . . between the timing of the leading or trailing edge of the reference clocks DQS and the points of change of the pieces of data DA, DB, DC.

As described above, since the reference clock from the semiconductor device is generated therein, the timing of its generation is greatly affected by the device temperature; for instance, as depicted in FIG. 14, reference clocks DQS1, DQS2, DQS3, . . . from individual semiconductor devices under test A, B, C, . . . are phased apart. Moreover, in the case of memory devices, such a phase difference is caused not only by device-to-device temperature variation but also by the difference in the memory address accessed in the respective memory device and by what is called jitter J in the rise and fall timing of each reference clock that is caused by an increase in the device temperature due to an extended period of operation as indicated by the broken lines.

Accordingly, to measure the time intervals dI1, dI2, dI3, . . . , or dJ1, dJ2, dJ3, . . . between the timing of the leading or trailing edge of the reference clock DQS and the points of change of the data DA, DB, DC, . . . , it is necessary to provide as a known value the timing of the leading or trailing edge of the reference clock DQS which is output from each semiconductor device.

The timing of generation of the reference clock DQS could be obtained as a known value by: applying all test patterns (over all test cycles) to each DUT in a sequential order; measuring the timing of generation of the reference clock DQS that is generated at the time of reading out of each test pattern; storing the measured values in a memory or the like; and conducting the actual test after obtaining data on the timing of generation of the reference clock DQS over all the test cycles. That is, the timing of generation of the reference clock DQS and the point of change of the output data are measured with reference to the operating clock that defines the test cycle of the tester.

In the actual test, the timing of generation of the reference clock DQS prestored in the memory is read out thereof for each test cycle, and the time difference (the phase difference relative to the test cycle) from the read-out timing of generation of the reference clock DSQ to the timing of the leading or trailing edge of each data is measured. In the testing of the timing of the leading edge of the data DQ, the timing is judged as "pass" or "fail" depending on whether the phase difference is smaller than the predetermined value Tdq or not. In the testing of the trailing edge of the data DQ, it is necessary only to decide whether the phase difference between the timing of generation of the reference clock DQS and the timing of the trailing edge of the data DQ is larger than the predetermined value Tdr.

In the case of conducting the actual test after obtaining the timing of generation of the reference clock DQS for all test cycles as described above, the time for the test is essentially twice longer than usual.

Further, since the timing of generation of the reference clock DQS contains random jitter J as depicted in FIG. 14, pre-measuring the generation timing over all the test cycles does not guarantee repeatability and hence reliability of the measured values. Accordingly, the test using such measured values is inevitably low in accuracy and consequently in reliability.

SUMMARY OF THE INVENTION

It is therefore an object of the present invention to provide a semiconductor device test method that permits real-time testing from the beginning and hence reduction of the test time and ensures the reliability of test conclusions in the test of a semiconductor device of the type that uses the reference clock generated by the device itself to decide whether the phase of each piece of data is within the range of a predetermined phase difference.

According to an aspect of the present invention, there is provided a method for testing a semiconductor device which outputs data and a reference clock synchronized therewith for use in passing the output data to other device, said method comprising the steps of:

(a) repeating operations of comparing the logic of said reference clock and said data with first and second expected values at the timing of first and second strobe pulses and outputting first and second comparison results while shifting the timing of said first and second strobe pulses by the same time width each time; and (b) upon each comparison at the timing of said first and second strobe pulses, deciding whether a logical combination of said first and second comparison results satisfies a predetermined logical condition, and based on the result of said decision, determining whether the timing of said data bear a predetermined phase relationship to the timing of said reference clock.

According to another aspect of the present invention, there is provided a semiconductor device tester which comprises:

a first timing comparator for comparing the timing of a reference clock output from a clock output terminal of a device under test with the timing of generation of a first strobe pulse;

a second timing comparator for comparing the timing of each piece of data output from each output terminal of said device under test with the timing of generation of a second strobe pulse;

a first logic comparator for comparing the result of timing comparison by said first timing comparator with a predetermined first expected value;

a second logic comparator for comparing the result of each timing comparison by said second timing comparator with a predetermined second expected value; and a logical condition decider for deciding whether a combination of the logical comparison results by said first and second logic comparators satisfies a predetermined logical condition.

As mentioned above, the semiconductor device test method and tester of the present invention detect that a combination of the results of decision for the reference clock and for each data satisfies a predetermined logical condition, thereby deciding that the data generating timing is not delayed behind the reference clock generating timing for more than a predetermined value. Alternatively, it is decided whether the duration of the reference clock from its reference edge to the trailing edge of the data is longer than a predetermined time.

By setting the phase of the strobe pulse for comparison with the data generating timing to a phase delayed for a predetermined time behind the phase of the strobe pulse for comparison with the reference clock generating timing, it is possible to decide that when a combination of the results of decision for the reference clock and for each data satisfies a predetermined logical condition, the data generating timing does not lag behind the delayed phase, or the duration of data is longer than a predetermined time.

Hence, the present invention offers a semiconductor device testing method and apparatus which enable semiconductor devices of the above-mentioned type to be tested in a short time and with high reliability by a relatively simple construction in which only the logical condition decider is provided in the stage following each logic comparator of a common semiconductor device tester.

BRIEF DESCRIPTION OF THE DRAWINGS

FIG. 11A is a truth table for explaining the operation of a logical condition decider based on the results of comparison with the leading edge of data;

FIG. 11B is a truth table for explaining the operation of a logical condition decider based on the results of comparison with the trailing edge of data;

DETAILED DESCRIPTION OF THE PREFERRED EMBODIMENTS

Figure 1:
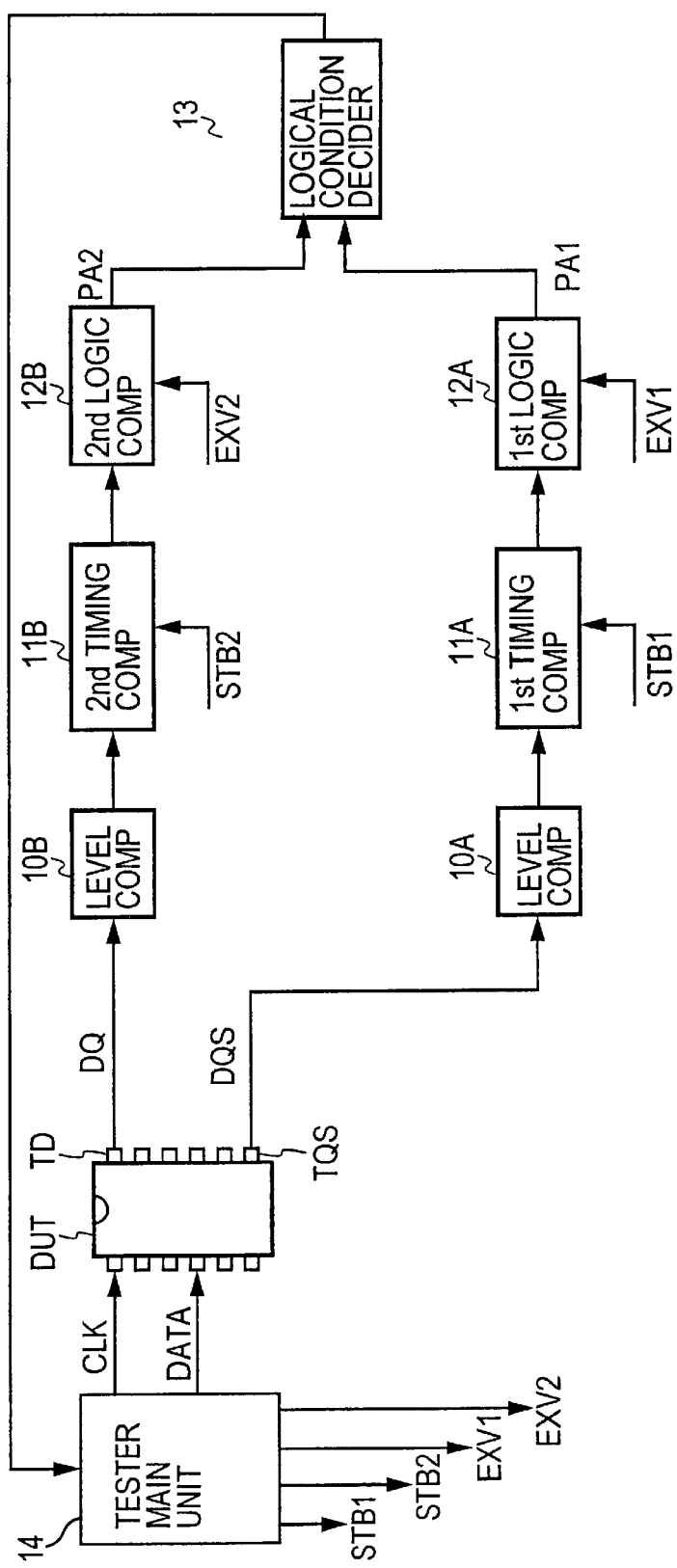
FIG. 1 is a block diagram for explaining an embodiment of the semiconductor device tester according to the present invention.

FIG. 1 illustrates in block form an embodiment of the semiconductor device tester according to the present invention for testing a semiconductor device that generates the reference clock DQS.

In FIG. 1, reference character DUT denotes a semiconductor device under test. A tester main unit 14 supplies the DUT with a clock CLK and data (data, address) synchronized therewith. The DUT has an output terminal TD from which the data DQ is output, and an output terminal TQS from which the reference clock DQS is output. Connected to the clock output terminal TQS is a cascade connection of a level comparator 10A, a first timing comparator 11A and a 1$^{st}$ or first logic comparator 12A.

Similarly connected to the data output terminal TD is a cascade connection of a level comparator 10B, a timing comparator 11B and a second logic comparator 12B. The DUT is shown to have only one data output terminal TD, but in practice, it has about 16 output terminals TD. Accordingly, a level comparator, a timing comparator and a logic comparator are cascade-connected to each of the data output terminals TD. The cascade connection may be the same as that used in the conventional semiconductor device tester.

The constitution characteristic of the present invention lies in the provision of a logical condition decider 13 that decides whether a logical combination of the results, PA1 and PA2, of comparison of the reference clock DQS and each data DQ with corresponding expected values, which are provided from the first and second logic comparators 12A and 12B, respectively, satisfies a predetermined logical condition.

Figure 2:
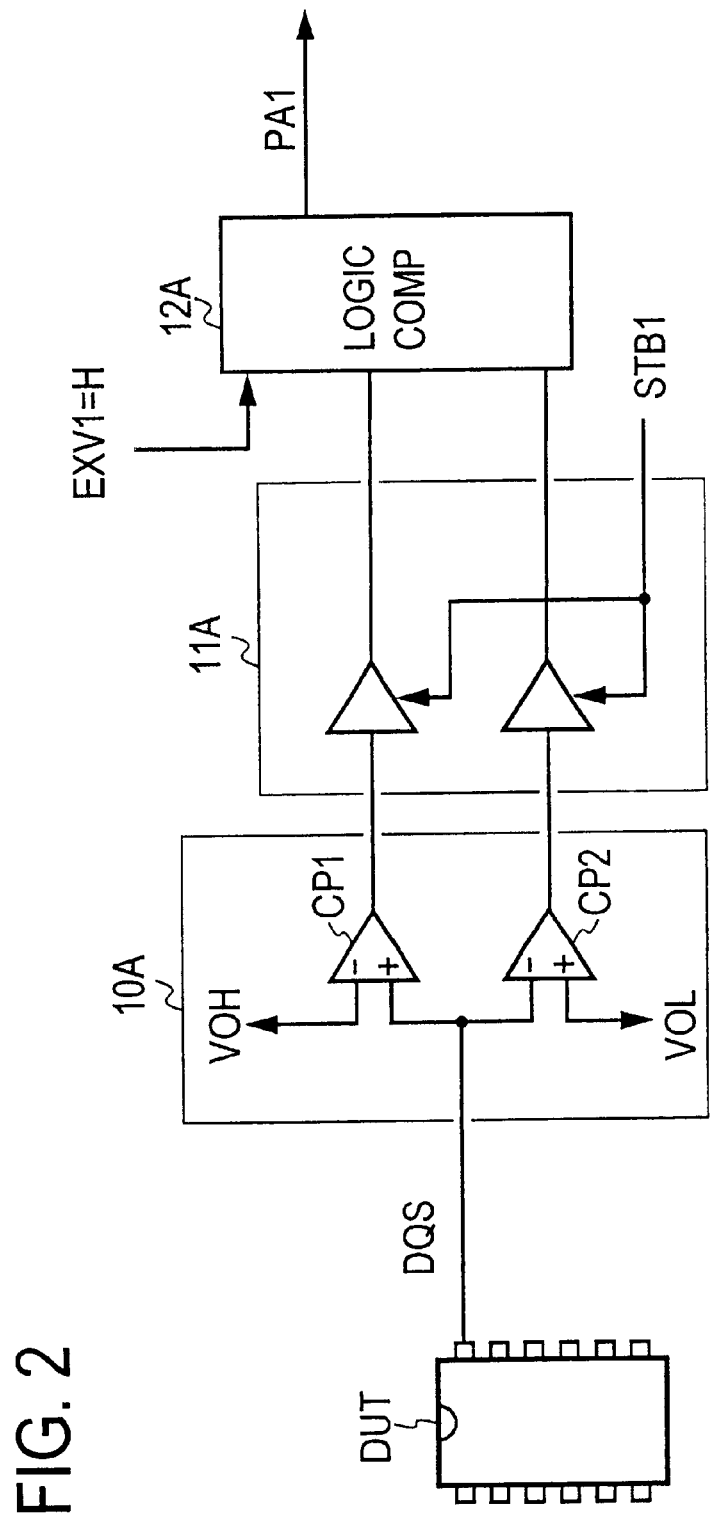
FIG. 2 is a block diagram for explaining, a level comparator and a timing comparator for use in the present invention.

A description will be given first, with reference to FIG. 2, of the operation of each of the first and second timing comparators 11A and 11B. Since the level comparator 10B, the second timing comparator 11B and the second logic comparator 12B are identical in construction with the level comparator 10A, the first timing comparator 11A and the first logic comparator 12A, respectively, and hence they are not shown in FIG. 2.

The level comparator 10A comprises a pair of voltage comparators CP1 and CP2. A non-inverting input terminal of the voltage comparator CP1 and an inverting input terminal of the voltage comparator CP2 are connected, and the reference clock DQS from the DUT is provided to the connection point. An H-logic reference voltage VOH is fed to an inverting input terminal of the voltage comparator CP1 and an L-logic reference voltage VOL is fed to a non-inverting input terminal of the voltage comparator CP". It is decided by the pair of voltage comparators CP1 and CP2 whether the logical value of the reference clock DQS (see FIG. 8) from the DUT satisfies normal voltage conditions. The voltage comparator CP1 decides whether the H-logic voltage the reference clock DQS is above the reference voltage value VOH. The voltage comparator CP2 decides whether the L-logic voltage of the reference clock DQS is below the reference voltage value VOL.

The results of decision by the voltage comparators CP1 and CP2 are provided to the timing comparator 11A, in which the states of the outputs from the voltage comparators CP1 and CP2 are read out with the timing of application of a strobe pulse STB1 from the tester main unit 14 (see FIG. 1). Accordingly, if the reference clock DQS is higher than the reference voltage VOH, then outputs "1" and "0" from the voltage comparators CP1 and CP2 are provided from the timing comparator 11A. If the reference clock DQS is lower than the reference voltage VOL, then outputs "0" and "1" from the voltage comparators CP1 and CP2 are provided from the timing comparator 11A. When the reference clock DQS is intermediate between the reference voltage s VOH and VOL, "0" and "0" are output. The two outputs from the timing comparator 11A, which has taken in the logic outputs from the voltage comparators CP1 and CP2, will hereinafter be represented by "10", "01" or "00".

The logic comparator 12A performs a comparison between the read-out result by the timing comparator 11A at the timing of the strobe pulse STB1 and an expected value EXV1 (logic H="10" in the example of FIG. 1) predetermined for each test cycle, and makes a pass/fail decision, providing a pass/fail output PA1.

When the expected value EXV1 is logic H="10", the logic comparator 12A gives the pass or fail result, depending on whether the logical values from the voltage comparators CP1 and CP2 are "10", or "00" or "01". When the expected value EXV1 is logic L="01", the logic comparator 12A gives the pass or fail result, depending on whether the logical values from the voltage comparators CP1 and CP2 are "01", or "00" or "10". The logic comparator 12A outputs, for example, PA1="0" indicating the pass result and PA1="1" indicating the fail result. The constructions and operations of the second level comparator 10B, the second timing comparator 11B and the second logic comparator 12B for the data DQ are the same as the above-described constructions and operations of the first level comparator 10A, the first timing comparator 11A and the first logic comparator 12A. For the output data DQ from the DUT the logic comparator 12B gives pass/fail results PA2 based on an expected value EXV2.

Figure 3:
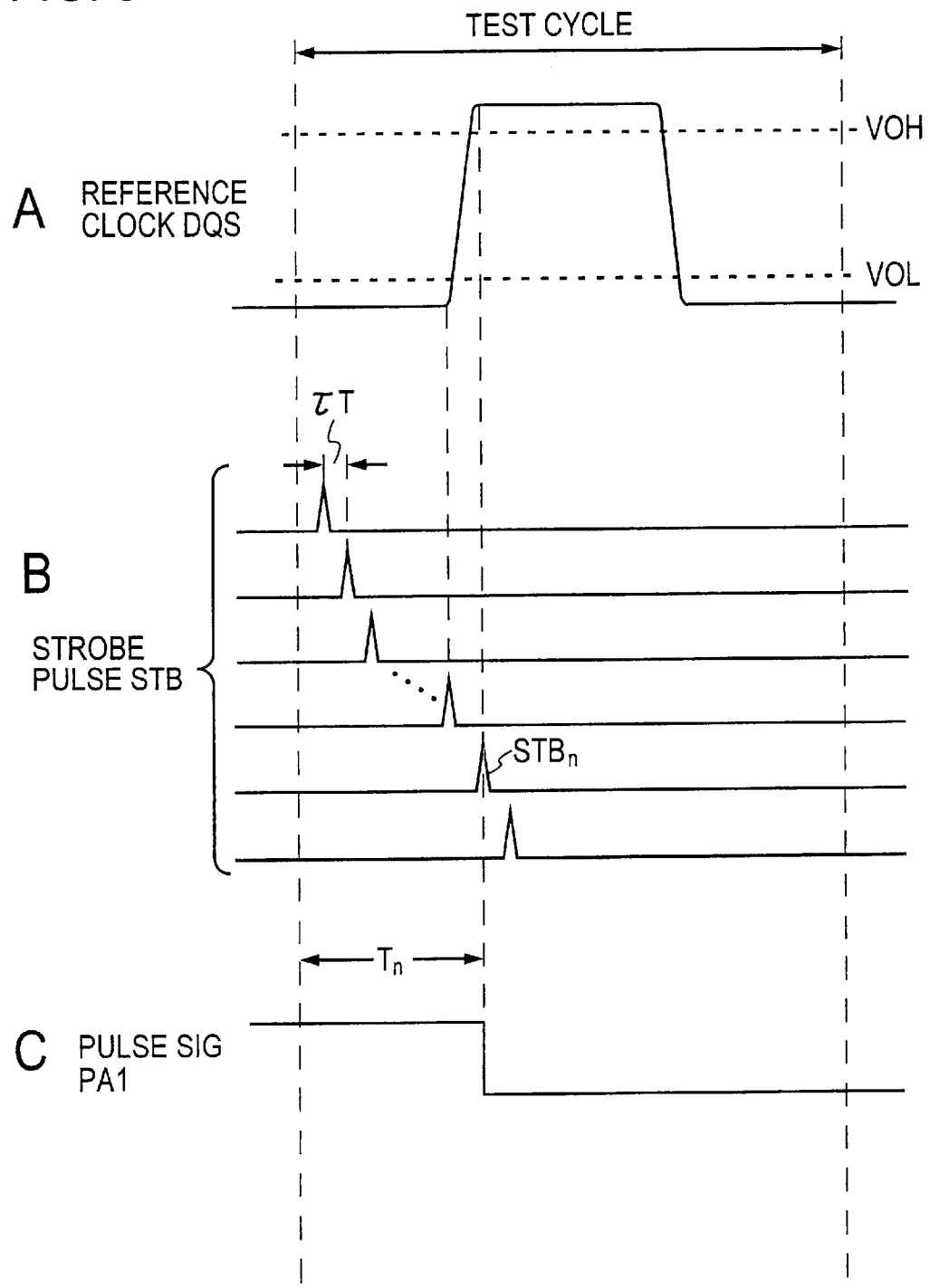
FIG. 3 is a timing chart for explaining the operation of the timing comparator depicted in FIG. 2.

Turning next to FIG. 3, an operation of detecting the rise timing of the reference clock DQS will be described below. In the test cycle in which to detect the rise timing of the reference clock DQS, the same test is repeated while delaying the strobe pulse STB1 in steps of $\tau T$ (see FIG. 3).

That is, to repeat the same test while delaying the strobe pulse STB1 in steps of $\tau T$ means that, for each test, the strobe pulse STB1 is delayed in steps of $\tau T$ and provided to the first timing comparator 11A to read out the states of the outputs from the voltage comparators CP1 and CP2. Upon each application thereto of the outputs from the first timing comparator 11A, the first logic comparator 12A compares them with the expected value EXV1 and gives the pass/fail results PA1.

In this instance, it is detected by a change of the output PA1 of the first logic comparator 12A from fail ("1") to pass ("0") which of the strobe pulses $STB1_n$ (FIG. 3B) was applied to the first level comparator 11A at the time of reversal of the output from the first level comparator 10A from the L to the H logic, and the rise timing $T_n$ of the reference clock DQS is determined accordingly.

In the case of detecting the fall timing of the reference clock DQ, the expected value EXV1 is set to L logic="01" and, as in the case of detecting the rise timing, the fall timing is determined based on the strobe pulse applied when the output from the first logic comparator 12A changed from "fail" to "pass".

The second level comparator 10B, the second timing comparator 11B and the second logic comparator 12B also perform the same operations as those of the first level comparator 10A, the first timing comparator 11A and the first logic comparator 12A, and determine the rise and fall timing of the data DQ in the same manner as in the case of detecting the rise and fall timing of the reference clock DQS.

From the above, the operations of the level comparators 10A, 10B, the timing comparators 11A, 11B and the logic comparators 12A, 12B, which are common to the operations in the prior art, will be understood.

Next, a description will be given of the operations of the timing comparators 11A and 11B related to the present invention. The first timing comparator 11A for comparison of the timing of generation of the reference clock DQS is supplied with the strobe pulse STB1, and the second timing comparator 11B for comparison of the timing of generation of the data DQ is supplied with the strobe pulse STB2. These strobe pulses STB1 and STB2 are displaced Tdq apart in phase. The phase difference Tdq is a predetermined delay time that is used to decide that the data terminal from which the data DQ is provided is fail (defective) when the data DQ lags behind the leading edge (in this example) of the reference clock DQS in excess of the phase difference Tdq.

Figure 14:
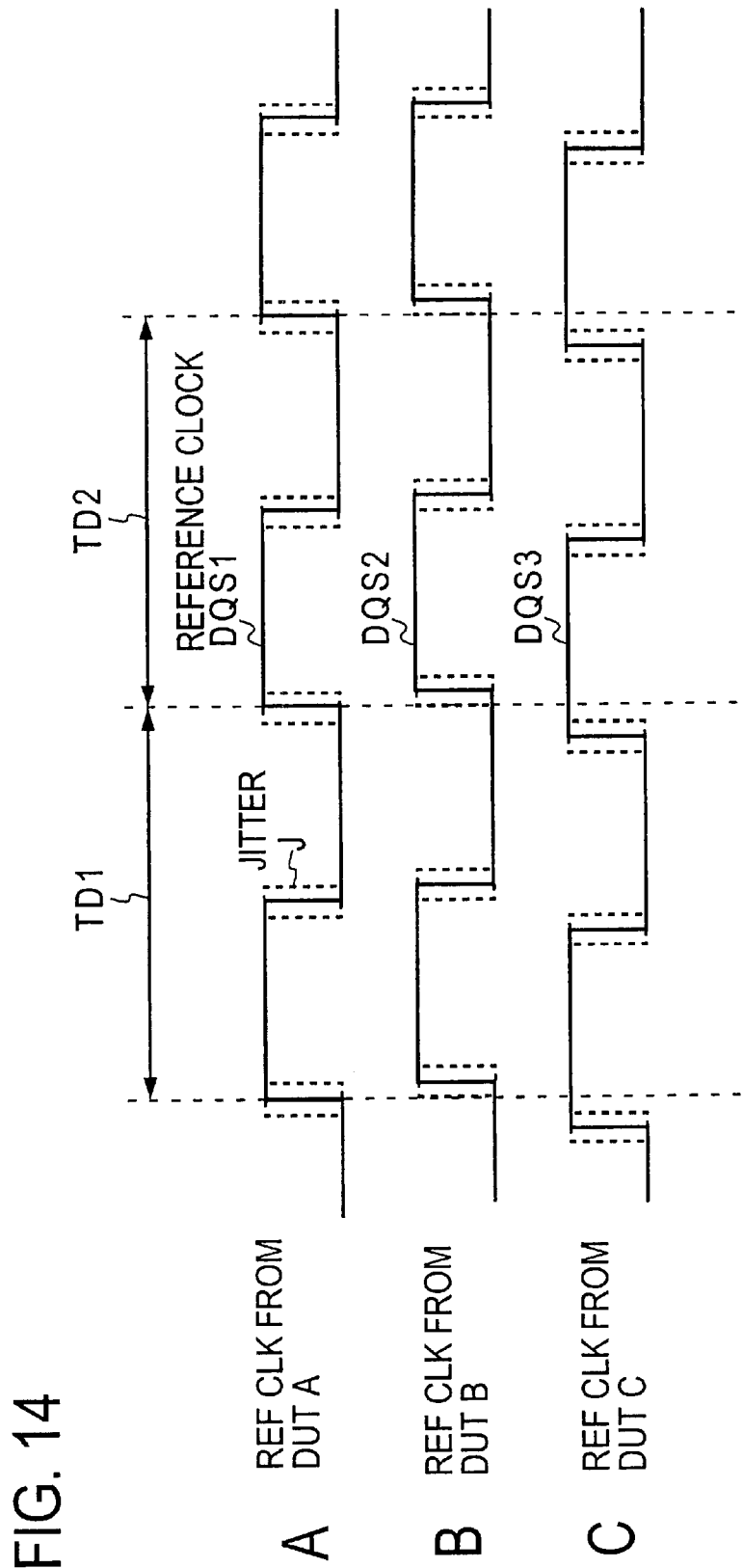
FIG. 14 is a timing chart for explaining jitter of output data of the semiconductor device under test.

The strobe pulses STB1 and STB1 are used to detect, for example, the rise timing of the reference clock DQS and the point of change of the data DQ while shifting little by little the range of jitter of the reference clock DQS described previously with respect to FIG. 14. This operation will hereinafter be referred to as a search operation.

Figure 4:
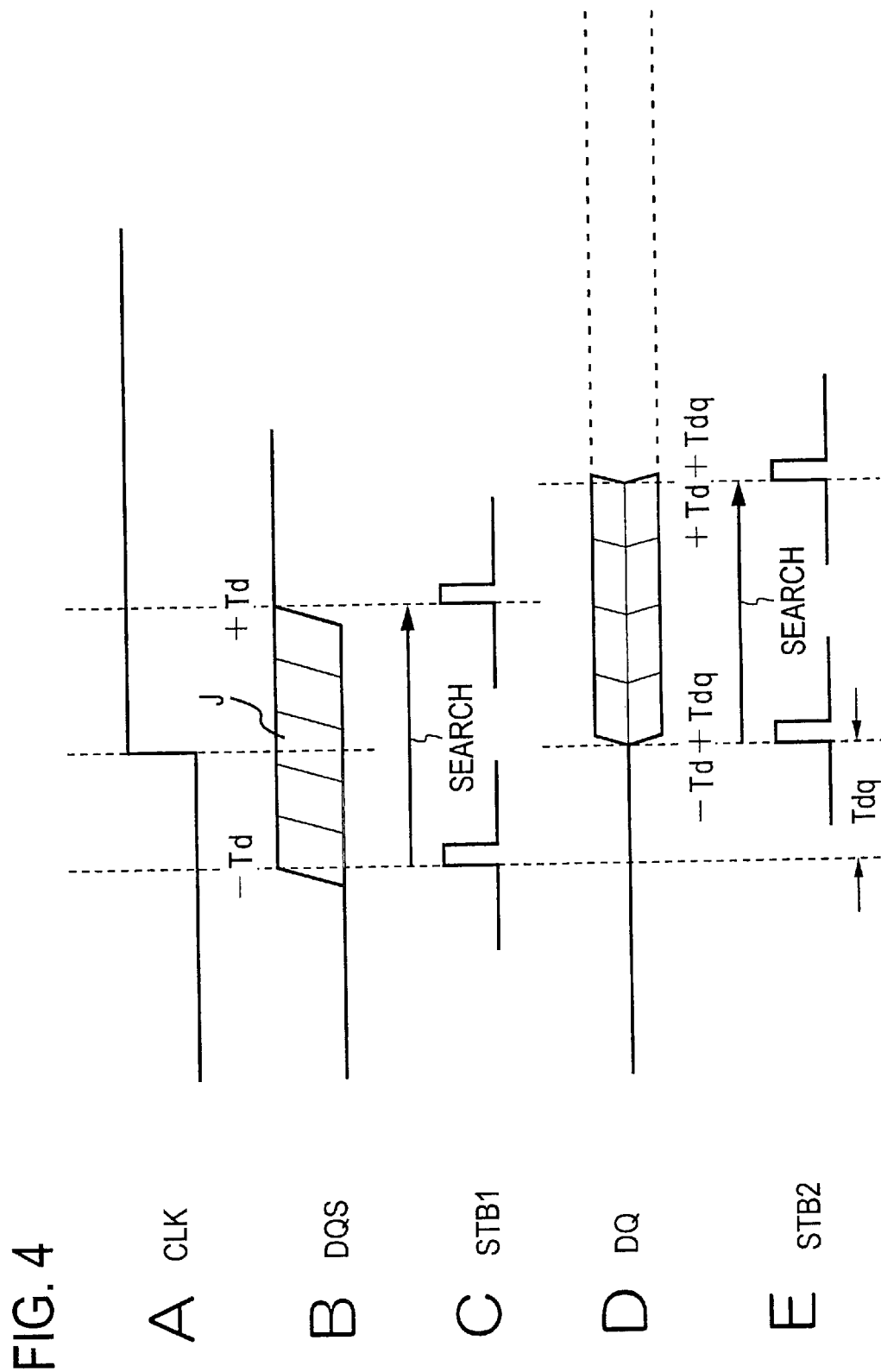
FIG. 4 is a timing chart for explaining the relationship between the reference clock from the semiconductor device under test and data.

Referring next to FIG. 4, the range of the search operation will be described. The jitter J of the reference clock DQS occurs centering about the timing of the leading edge of the clock CLK that defines the operation of the DUT. When the DUT is non-defective, the point of change of the data DQ also varies within the range of the jitter J that occurs in the reference clock DQS. Accordingly, if the range of occurrence of the jitter J is set to ±Td with respect to the leading edge of the clock CLK as shown in FIG. 4B, the search is made while shifting the phase of the strobe pulse STB1 little by little (for example, in steps of τT depicted in FIG. 3) from −Td to +Td and shifting the phase of the strobe pulse STB2 from −Td+Tdq to +Td+Tdq.

During the search operation the timing of generation of the reference clock DQS is detected by the strobe pulse STB1 and the timing of generation of the data DQ is compared with the strobe pulse STB2.

Based on which of the phase difference Ta between the reference clock DQS and the data DS and the phase difference between the strobe pulses STB1 and STB2 is larger than the other, the logical condition decider 13 outputs the result of its decision.

A description will be described below of the case where the expected value is H-logic when the reference clock DQS "H" and the effective data of the data DQ is also "H".

The first and second logic comparators 12A and 12B both output logic "0" (pass) or "1" (fail), depending on whether the logic "1" or "0" of the reference clock DQS and the data DQ are latched at the instant of application of the strobe pulses STB1 and STB2 during the logic "1" or "0" period of the reference clock DQS and the data DQ, respectively.

Figures 5A, 5B:
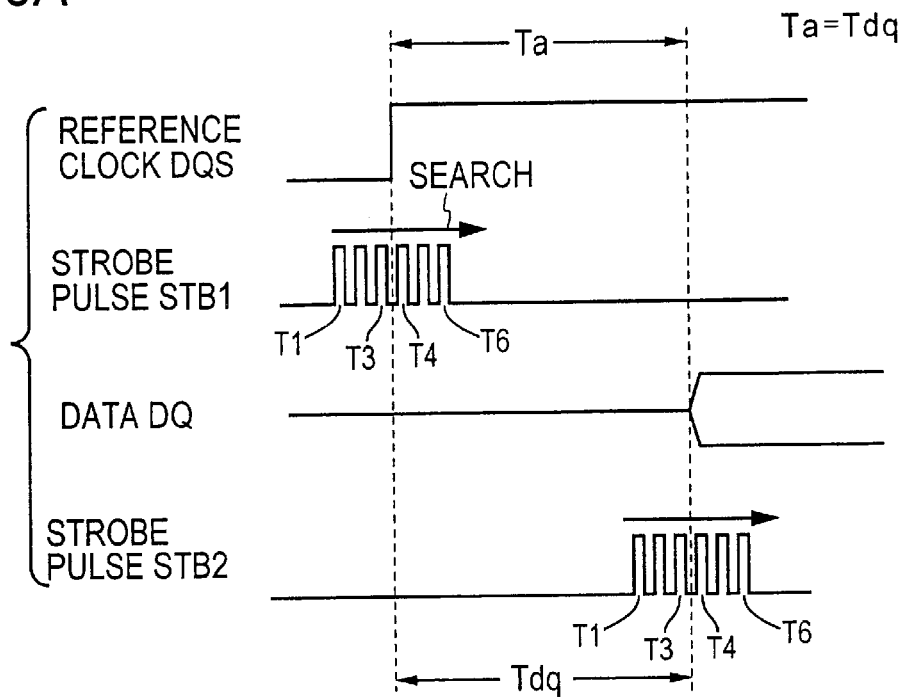
FIG. 5A is a timing chart for explaining how to test the timing of the leading edge of data with Ta=Tdq.
FIG. 5B is a table showing the results of logical comparison by the FIG. 5A test scheme in time sequence.

FIG. 5A shows a timing chart in the case where the phase difference Ta between the rise of the reference clock DQS and the point of change of the data DQ is equal to the phase difference Tdq between the strobe pulses STB1 and STB2. In this case, when the strobe pulses STB1 and STB2 are applied during the logic "0" period preceding the rise timing of the reference clock DQS and the point of change of the data DQ (for example, the point of change where it goes up to logic "1"), the first and second logic comparators 12A and 12B both output logic "1" (fail) as indicated in T1, T2 and T3 of the comparison timing column in FIG. 5B. When the search operation by the strobe pulses STB1 and STB2 proceeds and the strobe pulse STB1 reaches the leading edge of the reference clock DQS, the strobe pulse STB2 also arrives at the point of change of the data DQ because Ta=Tdq. As a result, the first and second logic comparators 12A and 12B both output logic "0" (pass) as indicated in T4, T5 and T6 in FIG. 5B.

Figures 6A, 6B:
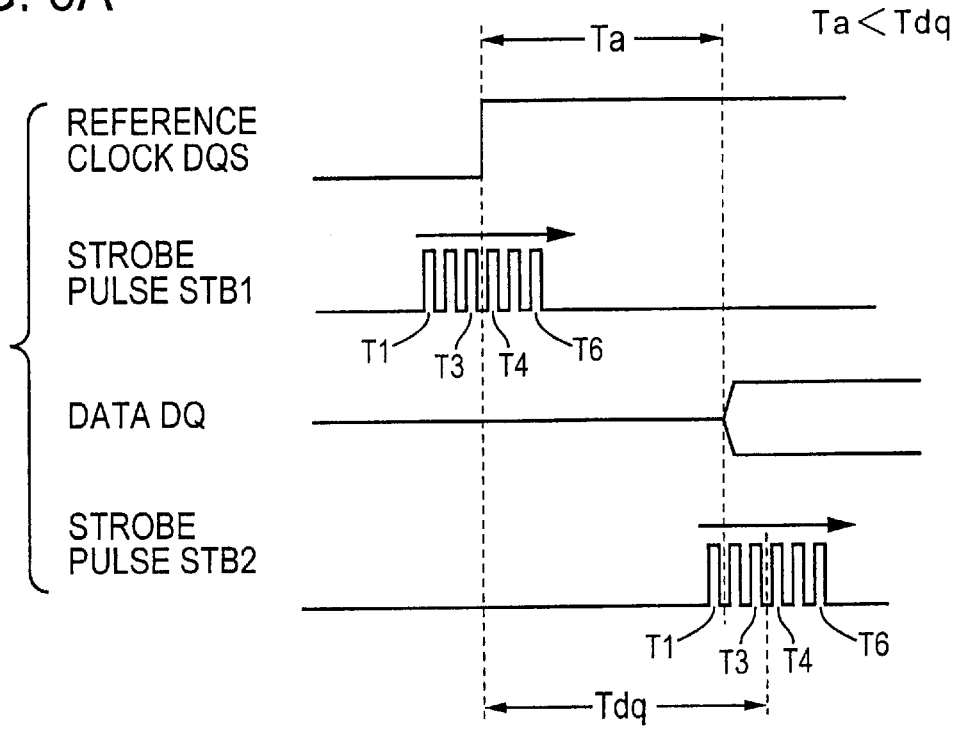
FIG. 6A is a timing chart for explaining how to test the timing of the leading edge of data with Ta<Tdq.
FIG. 6B is a table showing the results of logical comparison by the FIG. 6A test scheme in time sequence.

Next, a description will be given of the case where Ta<Tdq (that is, the required specifications are met). In this instance, in the search operation the strobe pulse STB2 arrives at the point of change of the data DQ earlier than the strobe pulse STB1 as shown in FIG. 6A. As a result, the second logic comparator 12B outputs logic "0" (pass) already at timing T2 as shown in FIG. 6B, but the first logic comparator 12A still keeps on outputting logic "1" (fail). At the point in time the search operation by the strobe pulses STB1 and STB2 reaches logic comparison timing T4, the strobe pulse STB1 reaches the timing of the leading edge of the reference clock DQS. As a result, the first logic comparator 12A outputs logic "0" (pass) at the timing T4.

Figures 7A, 7B:
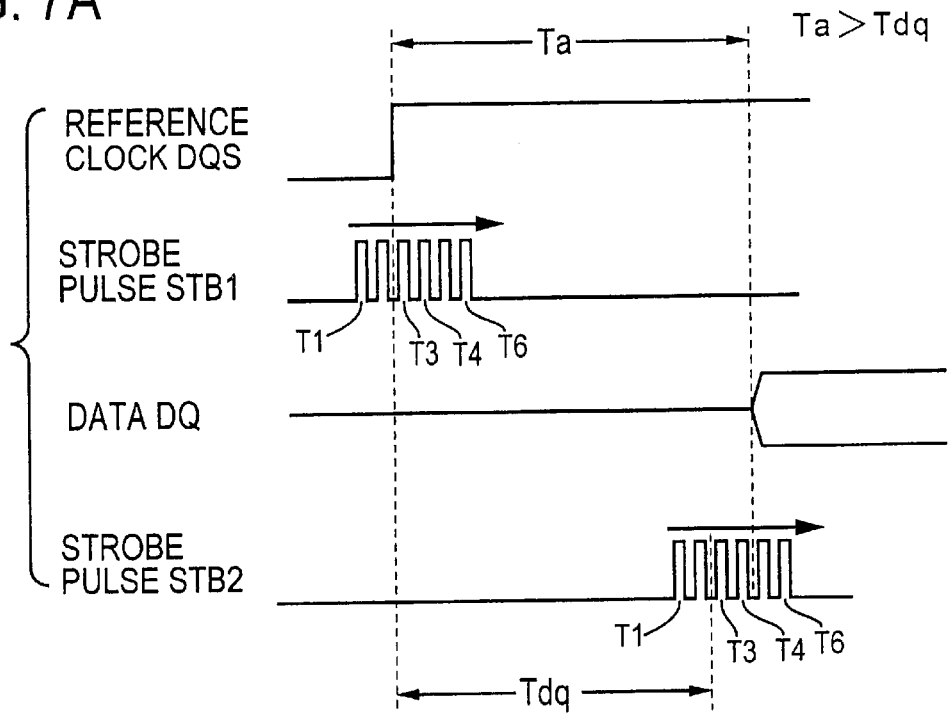
FIG. 7A is a timing chart for explaining how to test the timing of the leading edge of data with Ta>Tdq.
FIG. 7B is a table showing the results of logical comparison by the FIG. 7A test scheme in time sequence.

In the case of Ta>Tdq (the required specifications are not met), the strobe pulse STB1 reaches the timing of the leading edge of the reference clock DQS earlier than the strobe pulse STB2 as depicted in FIG. 7A. In consequence of this, as shown in FIG. 7B, the first logic comparator 12A outputs logic "0" (pass) at the timing T3, but the second logic comparator 12B keeps on outputting logic "1" (fail). When the search operation by the strobe pulses STB1 and STB2 reaches the comparison timing T5, the strobe pulse STB2 arrives at the point of change of the data DQ and the logic comparison output from the second logic comparator 12B reverses to logic "0" as depicted in FIG. 7B.

As will be understood from the above, by detecting the state in which the outputs PA1 and PA2 from the first and second logic comparators 12A and 12B are "0" and "1", respectively, as indicated by the comparison timing T3 and T4 in FIG. 7B, it is possible to detect that the phase difference Ta between the reference clock DQS and the data DQ is in excess of the predetermined value Tdq. Accordingly, by setting a truth table of the logical condition decider 13 so that it provides a fail "1" output when the outputs PA1 and PA1 are "0" and "1", respectively, and a pass "0" output at all other times, it is possible to provide the logic "1" (fail) in the case of Ta>Tdq.

The above description has been given of the case deciding whether the timing of the leading edge of the data DQ is present in the range of the predetermined time Tdq following the rise timing of the reference clock DQS, but a use may sometimes demand to make a check to determine whether the trailing edge of the data DQ appears a predetermined time after the rise timing of the reference clock DQS.

FIGS. 8 to 10 show how to make a check to see if the trailing edge of the data DQ appears a predetermined time Tdr after the rise timing of the reference clock DQS. Reference character Tb denotes the time interval between the leading edge of the reference clock DQS and the trailing edge of the data DQ, and Tdr denotes the phase difference between the strobe pulses STB1 and STB2. In this instance, too, the strobe pulses STB1 and STB2 are used to perform the search operation over the timing range from T1 to T6 that corresponds to the range of jitter caused in the reference clock DQS and the data DQ.

Figures 8A, 8B:
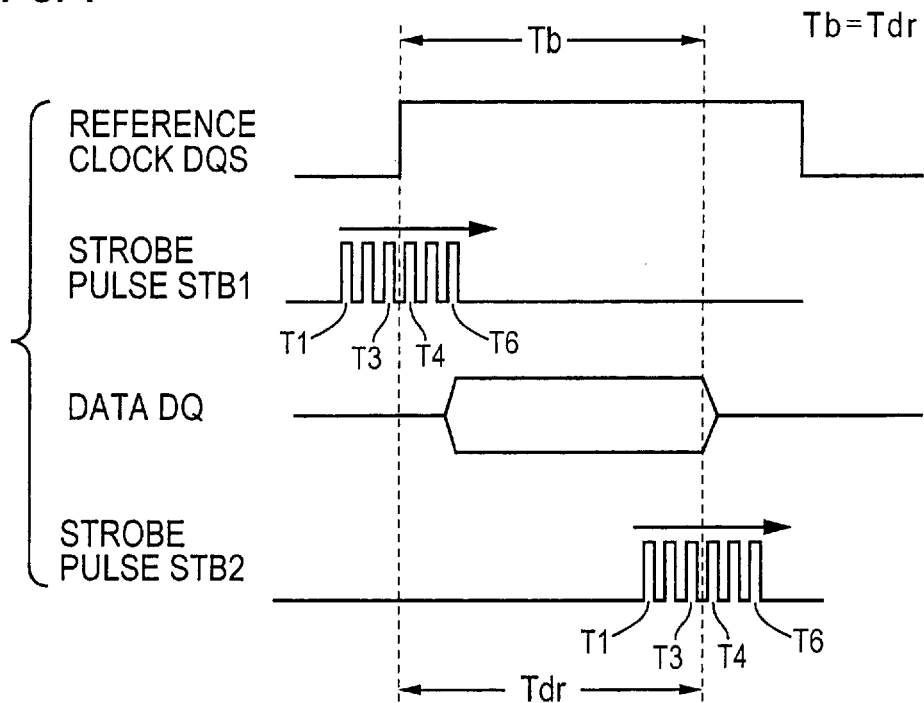
FIG. 8A is a timing chart for explaining how to test the timing of the trailing edge of data with Tb=Tdr.
FIG. 8B is a table showing the results of logical comparison by the FIG. 8A test scheme in time sequence.

FIG. 8A shows the case where Tb=Tdr. In this case, while the second logic comparator 12B outputs the pass logic "0" at the comparison timing T1, T2 and T3 in FIGS. 8A and 8B, the first logic comparator 12A outputs the fail logic "1". Upon detecting the timing of the leading edge of the reference clock DQS by the strobe pulse STB1, the first logic comparator 12A outputs the pass logic "0". At this time, the strobe pulse STB2 coincides with the trailing edge of the data DQ, and the second logic comparator 12B outputs the fail logic "1" at the comparison timing T4.

Figures 9A, 9B:
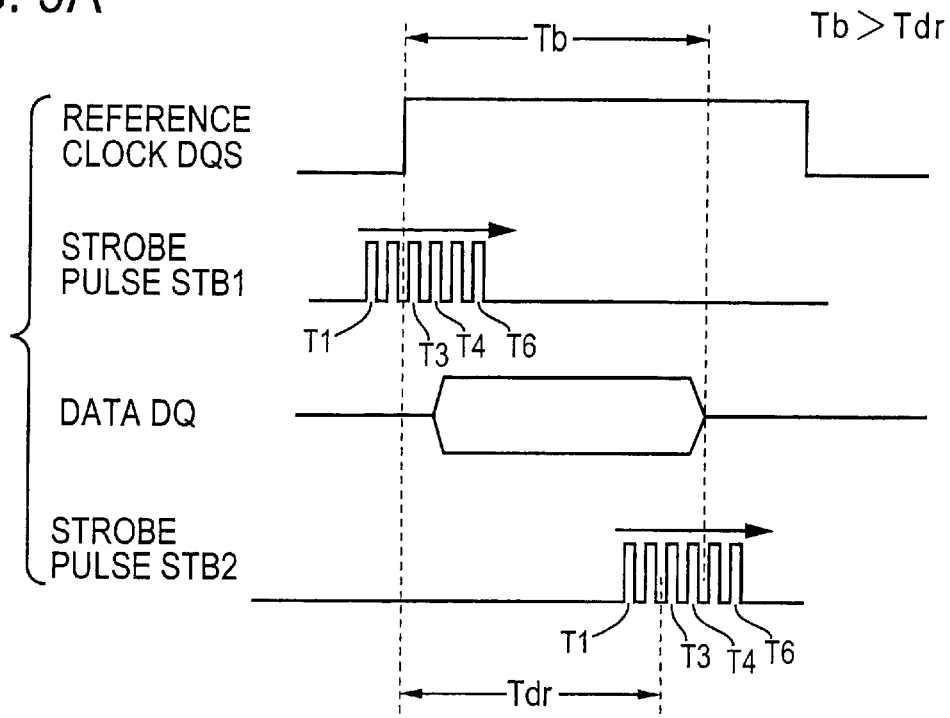
FIG. 9A is a timing chart for explaining how to test the timing of the trailing edge of data with Tb>Tdr.
FIG. 9B is a table showing the results of logical comparison by the FIG. 9A test scheme in time sequence.

FIGS. 9A and 9B show the case where Tb>Tdr (the required specifications are met). In this case, the first and second logic comparators 12A and 12B both output the pass logic "0" at the comparison timing T3 and T4 in FIGS. 9A and 9B, and thereafter the second logic comparator 12B begins to output the fail logic "1" at the timing T5 when the strobe pulse STB2 detects the trailing edge of the data DQ.

Figures 10A, 10B:
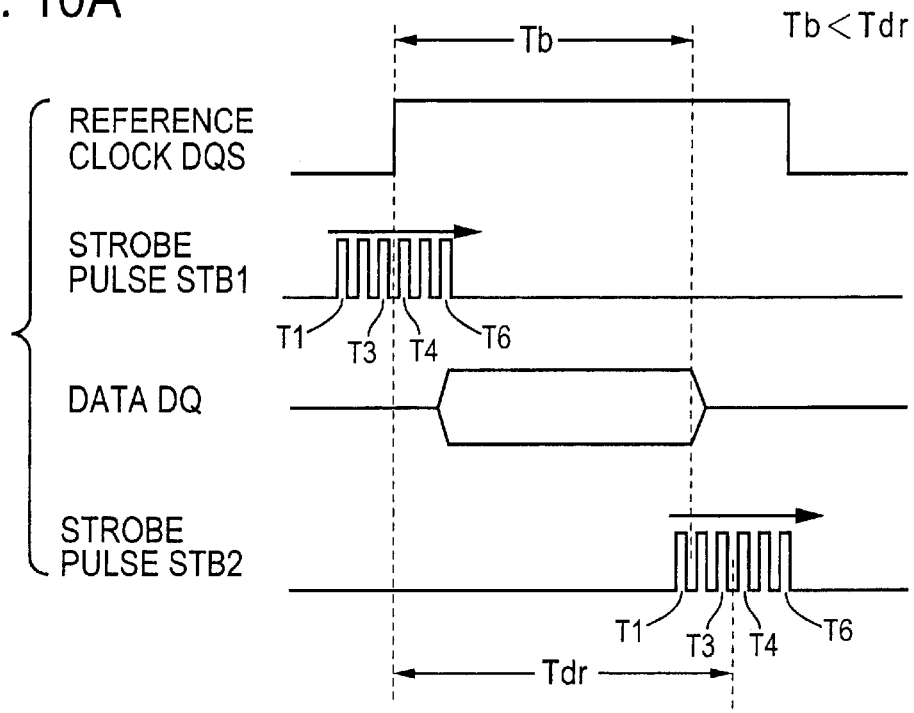
FIG. 10A is a timing chart for explaining how to test the timing of the trailing edge of data with Tb<Tdr.
FIG. 10B is a table showing the results of logical comparison by the FIG. 10A test scheme in time sequence.

FIGS. 10A and 10B show the case where Tb<Tdr (the required specifications are not met). In this case, there arise a state where the first and second logic comparators 12A and 12B simultaneously output the fail logic "1" as indicated by the comparison timing T2 and T3 in FIG. 10B.

Accordingly, in the case of making a check to see if the data DQ remains effective for more than a predetermined time after the timing of the leading edge of the reference clock DQS, it is recommended to set the truth table of the logical condition decider 13 so that it outputs the fail logic "1" when the outputs PA1 and PA2 from the first and second logic comparators 12A and 12B are both logic "1", and outputs the pass logic "0" at all other times as depicted in FIG. 11B.

Figure 12:
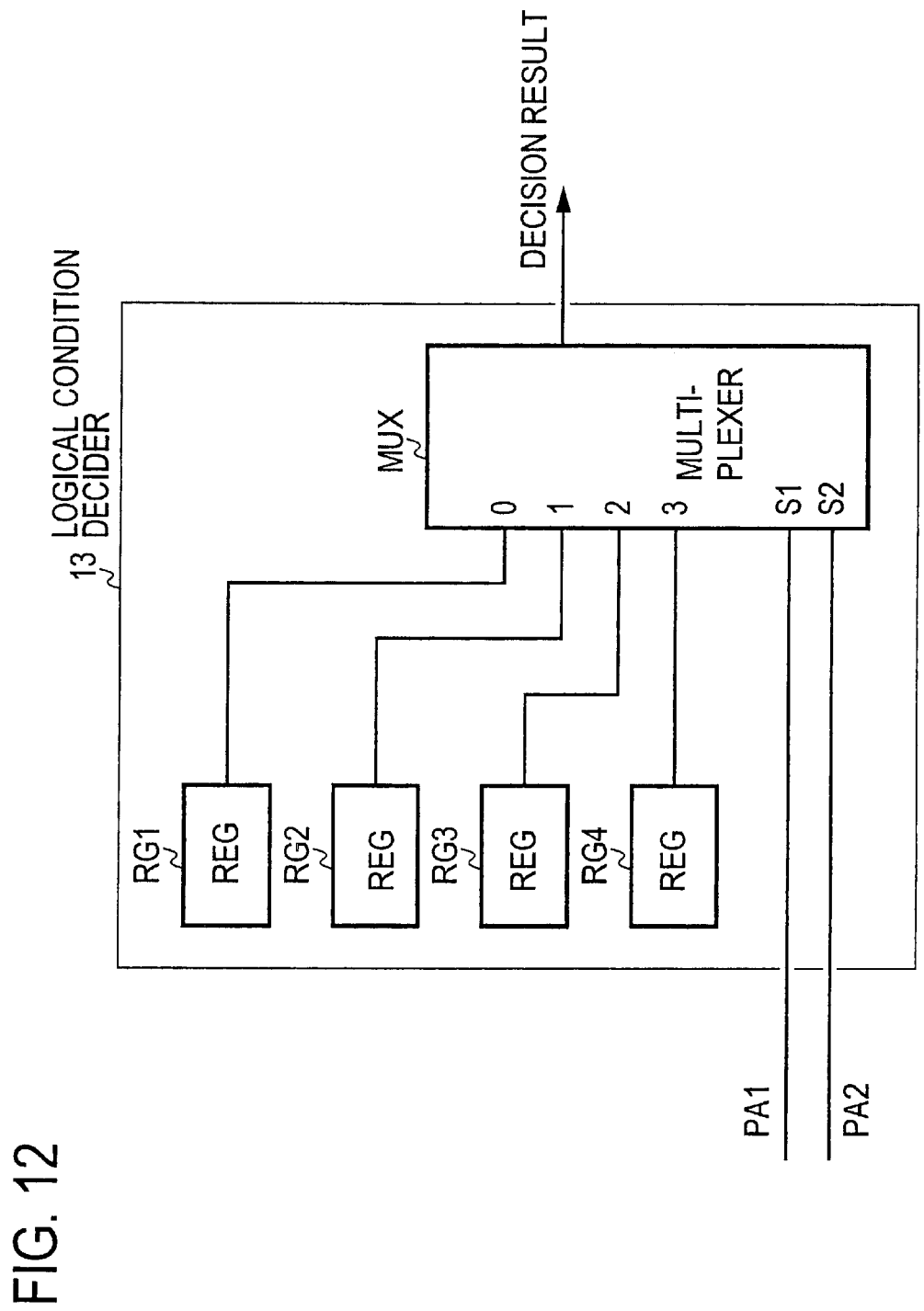
FIG. 12 is a block diagram for explaining an example of a concrete configuration of the logical condition decider that constitutes the principal part of the present invention.
Figure 13:
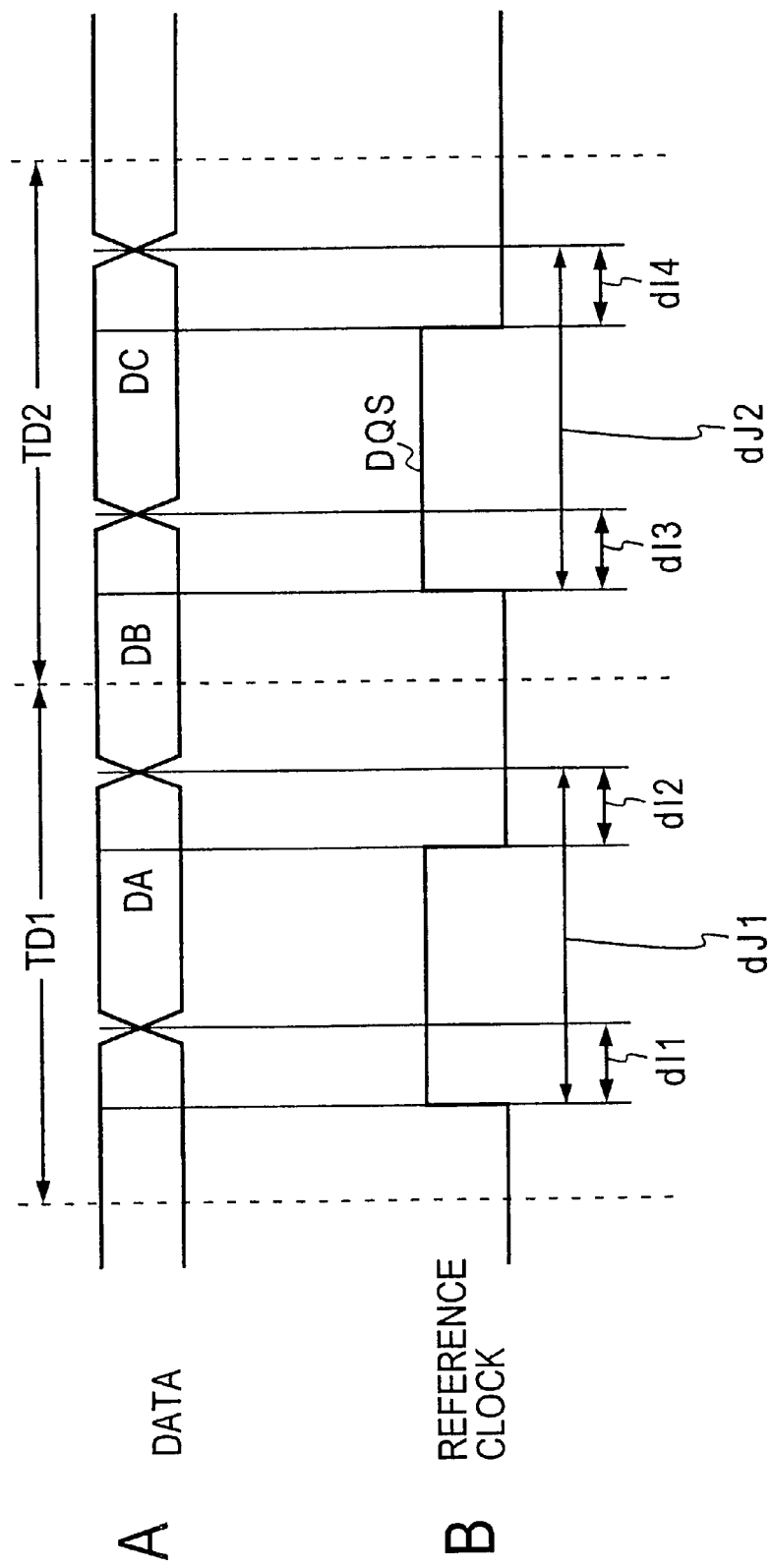
FIG. 13 is a timing chart for explaining the problem to be solved by the present invention.

FIG. 12 illustrates in block form a concrete example of the logical condition decider 13, which is shown to comprise four registers RG1, RG2, RG3 and RG4, and a multiplexer MUX which uses two-bit select signals PA1 and PA2 to select and take out data set in the four registers RG1 to RG4.

The user is allowed to arbitrarily set pass and fail logical values in the registers RG1 to RG4 according to the test contents. For example, in the case of performing a test on the leading edge of the data DQ, 0, 0, 1, 0 are set in the registers RG1 to RG4 in accordance with the decision results given in the truth table of FIG. 11A, and the outputs from the first and second logic comparators 12A and 12B are provided as the select signals PA1 and PA2. Accordingly, when a combination of the outputs PA1 and PA2 from the first and second logic comparators 12A and 12B is "0"—"0", the multiplexer MUX selects and outputs the pass logic "0" set in the register RG1. When the combination of the outputs PA1 and PA2 is "1"–"0", the multiplexer MUX selects and outputs the pass logic "0" set in the register RG2. When the combination of the outputs PA1 and PA2 is "0"–"1", the multiplexer MUX selects and outputs the fail logic "1" set in the register RG3. And when the combination of the outputs PA1 and PA2 is "1"—"1", the multiplexer MUX selects and outputs the pass logic "0" set in the register RG4. These decision results are provided, for example, to the test main unit 14 (FIG. 1).

In the case of making a test on the trailing edge of the data DQ, 0, 0, 0, 1 are set in the registers RG1 to RG4 in accordance with the decision results given in the truth table of FIG. 11B.

With the logical condition decider 13 constructed as described above, the user is allowed to freely make his desired test. Further, the logical condition decider 13 can be used not only for the timing of the leading and trailing edges of the data DS but also for other test items.

The configuration of the logical condition decider 13 is not limited to the FIG. 12 configuration, but it is also possible to employ a configuration in which a rewritable memory with the truth tables of FIGS. 11A and 11B written therein is used and the select signals PA1 and PA2 are used as addresses to read out therefrom the decision results.

As described above, when the logical condition decider 13 outputs the fail logic "1" even once in the search operation by the strobe pulses STB1 and STB2, the corresponding output pin can be decided as defective. That is, a small phase difference Tdq permits selection of high-grade semiconductors; and a large phase difference Tdq provides an increased success rate in selecting non-defective devices and enables selection of semiconductor devices of a high data retaining rate.

While in the above the timing of the point of change of the data has been described to be measured with reference to the leading edge of the reference clock, it is evident that it can also be measured with reference to the trailing edge of the reference clock.

EFFECT OF THE INVENTION

As described above, the present invention permits reduction of the time for testing semiconductor devices because the invention adopts the test method which, even if the phase of the reference clock DQS varies which is used as the reference for measuring the generating timing of each piece of data, makes a real-time comparison between the phase of the reference clock DQS and the phase of each piece of data for each test cycle to detect that the phase difference Ta is larger than the set value Tdq, and decides it to be fail, and the test method which detects that the phase difference Tb is smaller than the set value Tdr, and decides it to be fail. Moreover, since the phase difference between the reference clock DQS and the data DQ is measured actually using the phase of the reference clock DQS being generated at the point of execution of each test cycle, the test is performed taking into account phase variations of the reference clock DQS by a temperature change or the like—this ensures high reliability in test conclusions.

It will be apparent that many modifications and variations may be effected without departing from the scope of the novel concepts of the present invention.

What is claimed:

1. A method for testing a semiconductor device which outputs data and a reference clock synchronized therewith for use in passing the output data to another device, said method comprising the steps of:

(a) repeating operations of comparing the logic of said reference clock and said data with first and second expected values at the timing of first and second strobe pulses and outputting first and second comparison results while shifting the timing of said first and second strobe pulses by the same time width each time; and (b) upon each comparison at the timing of said first and second strobe pulses, deciding whether a logical combination of said first and second comparison results satisfies a predetermined logical condition, and based on the result of said decision, determining whether the timing of said data bear a predetermined phase relationship to the timing of said reference clock.

2. The method of claim 1, wherein said step (a) comprises the steps of:

(a-1) extracting the logic of said reference clock and said data at the timing of said first and second strobe pulses; and (a-2) comparing said logic extracted at the timing of said first and second strobe pulses with an expected value of said reference clock and an expected value of said data, and outputting logic indicating whether said logic matches said expected values, as said first and second comparison results.

3. The method of claim 2, wherein: said step (a) includes the step of setting the relationship between the timing of said first strobe pulse and the timing of said second strobe pulse to a predetermined permissible delay time from a predetermined one of leading and trailing edges of said reference clock to the leading edge of said data; and said step (b) includes the step of detecting that the logical decision results on said reference clock and on said data are decided to be pass and fail, respectively, and deciding that said data decided to be fail is generated more than a predetermined time after said predetermined leading or trailing edge of said reference clock.

4. The method of claim 2, wherein: said step (a) includes the step of setting the relationship between the timing of said first strobe pulse and the timing of said second strobe pulse to a predetermined necessary and shorted duration from a predetermined one of leading and trailing edges of said reference clock to the trailing edge of said data; and said step (b) includes the step of detecting that the logical decision results on said reference clock and on said data are both decided to be fail, and deciding that the trailing edge of said data decided to be fail is generated within a predetermined time after said predetermined leading or trailing edge of said reference clock.

5. The claim 3 or 4, wherein said step (b) includes the step of reading out of a prepared truth table the logical condition decision results corresponding to said first and second logical comparison results.

6. A semiconductor device tester comprising:
    a first timing comparator for comparing the timing of a reference clock output from a clock output terminal of a device under test with the timing of generation of a first strobe pulse;
    a second timing comparator for comparing the timing of each piece of data output from each output terminal of said device under test with the timing of generation of a second strobe pulse;
    a first logic comparator for comparing the result of timing comparison by said first timing comparator with a predetermined first expected value;
    a second logic comparator for comparing the result of each timing comparison by said second timing comparator with a predetermined second expected value; and
    a logical condition decider for deciding whether a combination of the logical comparison results by said first and second logic comparators satisfies a predetermined logical condition.

7. The device of claim 6, wherein: the relationship between the timing of said first strobe pulse and the timing of said second strobe pulse is set to a predetermined permissible delay time from a predetermined one of leading and trailing edges of said reference clock to the leading edge of said data; and said logical condition decider detects that the logical decision results on said reference clock and on said data are decided to be pass and fail, respectively, and decides that said data decided to be fail is generated more than a predetermined time after said predetermined leading or trailing edge of said reference clock.

8. The device of claim 6, wherein: the relationship between the timing of said first strobe pulse and the timing of said second strobe pulse is set to a predetermined necessary and shortest duration from a predetermined one of leading and trailing edges of said reference clock to the trailing edge of said data; and said logical condition decider detects that the logical decision results on said reference clock and on said data are both decided to be fail, and decides that the trailing edge of said data decided to be fail is generated within a predetermined time after said predetermined leading or trailing edge of said reference clock.

9. The device of claim 7 or 8, wherein said logical condition decider includes storage means having recorded therein a prepared truth table indicating logical condition decision results corresponding to possible combinations of said first and second comparison results, and reads out of said truth table in said storage means the logical condition decision results corresponding to a combination of said first and second logical comparison results.

10. The device of claim 9, wherein: said storage means has a plurality of registers having held therein the logical condition decision results corresponding to said possible combinations of said first and second logical comparison results, respectively; and said logical condition decider further includes a multiplexer for selecting that one of said plurality of registers which corresponds to an input combination of said first and second logical comparison results and for reading out the logical condition decision result set in said selected register.

11. The device of claim 9, wherein said storage means is a memory having written therein logical condition decision results corresponding to said possible combinations of said first and second logical comparison results.

* * * * *